United States Patent
Kunz et al.

(10) Patent No.: US 6,764,892 B2
(45) Date of Patent: Jul. 20, 2004

(54) DEVICE AND METHOD OF LOW VOLTAGE SCR PROTECTION FOR HIGH VOLTAGE FAILSAFE ESD APPLICATIONS

(75) Inventors: Keith E. Kunz, Plano, TX (US); Charvaka Duvvury, Plano, TX (US); Hisashi Shichijo, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/445,743

(22) Filed: May 27, 2003

(65) Prior Publication Data

US 2003/0222273 A1 Dec. 4, 2003

Related U.S. Application Data

(62) Division of application No. 09/947,272, filed on Sep. 5, 2001, now Pat. No. 6,576,959.

(51) Int. Cl.[7] .......................................... H01L 21/8238
(52) U.S. Cl. ................... 438/217; 438/217; 438/218; 438/219; 438/284; 257/355; 257/357; 257/358; 257/360; 257/363; 257/365; 257/374; 257/392; 257/408; 361/56; 361/58; 361/111
(58) Field of Search ................... 438/217, 218, 438/219, 284; 257/355, 357, 358, 360, 363, 365, 374, 392, 408; 361/56, 58, 111

(56) References Cited

U.S. PATENT DOCUMENTS

| | | | | |
|---|---|---|---|---|
| 6,538,266 B2 | * | 3/2003 | Lee et al. | 257/173 |
| 6,576,959 B2 | * | 6/2003 | Kunz et al. | 257/355 |
| 6,610,262 B1 | * | 8/2003 | Peng et al. | 423/197 |
| 6,674,622 B1 | * | 1/2004 | Yu et al. | 361/56 |

* cited by examiner

Primary Examiner—Allan R. Wilson
Assistant Examiner—Edgardo Ortiz
(74) Attorney, Agent, or Firm—W. James Brady, III; Frederick J. Telecky, Jr.

(57) ABSTRACT

A semiconductor circuit for multi-voltage operation having built-in electrostatic discharge (ESD) protection is described, comprising a drain extended nMOS transistor and a pnpn silicon controlled rectifier (SCR) merged with the transistor so that a dual npn structure is created and both the source of the transistor and the cathode of the SCR are connected to electrical ground potential, forming a dual cathode, whereby the ESD protection is enhanced. The rectifier has a diffusion region, forming an abrupt junction, resistively coupled to the drain, whereby the electrical breakdown-to-substrate of the SCR can be triggered prior to the breakdown of the nMOS transistor drain. The SCR has anode and cathode regions spaced apart by semiconductor surface regions and insulating layers positioned over the surface regions with a thickness suitable for high voltage operation and ESD protection.

18 Claims, 7 Drawing Sheets

DEVICE AND METHOD OF LOW VOLTAGE SCR PROTECTION FOR HIGH VOLTAGE FAILSAFE ESD APPLICATIONS

This is a division of application Ser. No. 09/947,272 filed Sep. 5, 2001, now U.S. Pat. No. 6,576,959.

FIELD OF THE INVENTION

The present invention is related in general to the field of electronic systems and semiconductor devices and more specifically to a structure and method of low voltage silicon controlled rectifier for preventing destructive electrostatic discharge in high voltage failsafe applications.

DESCRIPTION OF THE RELATED ART

Integrated circuits (ICs) may be severely damaged by electrostatic discharge (ESD) events. A major source of ESD exposure to ICs is from the charged human body ("Human Body Model", HBM); the discharge of the human body generates peak currents of several amperes to the IC for about 100 ns. A second source of ESD is from metallic objects ("machine model", MM); it can generate transients with significantly higher rise times than the HBM ESD source. A third source is described by the "charged device model" (CDM), in which the IC itself becomes charged and discharges to ground in the opposite direction than the HBM and MM ESD sources. More detail on ESD phenomena and approaches for protection in ICs can be found in A. Amerasekera and C. Duvvury, "ESD in Silicon Integrated Circuits" (John Wiley & Sons LTD. London 1995), and C. Duvvury, "ESD: Design for IC Chip Quality and Reliability" (Int. Symp. Quality in El. Designs, 2000, pp. 251–259; references of recent literature).

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an nMOS device whose drain is connected to the pin to be protected and whose source is tied to ground. The protection Level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism, found in the nMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level.

In U.S. Pat. No. 4,939,616, issued on Jul. 3, 1990 (Rountree, "Circuit Structure with Enhanced Electrostatic Discharge Protection"), a silicon controlled rectifier (SCR) is described as a protection device against ESD wherein the trigger mechanism is avalanche conduction at the interface between the n-well surrounding a portion of the protection device and the p-type substrate. The lowered threshold voltage is provided by a highly doped region of the same conductivity type as the well at the interface between the well and the substrate. This highly doped region is connected to a resistor which is then connected to the protected node. The resistor and heavily doped region at the intersection between the n-well and substrate provide an additional source of current for avalanching at a lower voltage. Thus the trigger voltage of the protection system is substantially lowered. For today's miniaturized circuit elements, however, the SCRs of the quoted patent are not fast enough and the described protection, therefore, not efficient enough.

In U.S. Pat. No. 5,903,032, issued on May 11, 1999 (Duvvury, "Power Device Integration for Built-in ESD Robustness"), covers the basic concept of a drain-extended (DE) nMOS transistor integrated with an SCR. However, the patent does not describe the technique for silicided technologies with lightly doped drain junctions—a structure and process commonly employed today. The patent is not sufficient for today's advanced CMOS technologies, which include shallow trench isolation, low resistance substrates, and silicided diffusions, all of which would essentially degrade the bipolar gains of the pnp and the npn transistors.

An urgent need has, therefore, arisen for a coherent, low-cost method of enhancing ESD insensitivity without the need for additional, real-estate consuming protection devices. The device structures should further provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

A semiconductor circuit for multi-voltage operation having built-in electrostatic discharge (ESD) protection is described, comprising a drain extended nMOS transistor and a pnpn silicon controlled rectifier (SCR) merged with the transistor so that a dual npn structure is created and both the source of the transistor and the cathode of the SCR are connected to electrical ground potential, forming a dual cathode, whereby the ESD protection is enhanced. The rectifier has a diffusion region, forming an abrupt junction, resistively coupled to the drain, whereby the electrical breakdown-to-substrate of the SCR can be triggered prior to the breakdown of the nMOS transistor drain. The SCR has anode and cathode regions spaced apart by semiconductor surface regions and insulating layers positioned over the surface regions with a thickness suitable for high voltage operation and ESD protection.

For improved ESD protection, the invention uses a transistor with high breakdown voltage and complements it with a low voltage SCR that has a low and fast trigger voltage. The low and fast trigger voltage is accomplished by creating high gain npn and pnp parasitic transistors using a fabrication method characterized by two features:

blocking the lightly doped drain implant over the area of the STI-blocked SCR. The invention provides a selective process by opening a window in a photoresist layer so that a low energy, low dose ion implant creates shallow, lightly doped layers under the surface only in regions for the extended source and drain of the MOS transistor; and selecting localized silicon nitride walls in a thickness sufficient to block the medium energy ion implant required for creating the deep source and drain regions.

In another embodiment of the invention, the process steps are reversed: The source drain implant is performed first and the silicon nitride walls are applied subsequently.

The device structure of the invention can be manufactured by two distinctly different process flows:

Self-aligned STI-blocked SCR: The silicide blocking process step, actualized by patterned silicon nitride layers over the bases of the pnp and npn portions of the SCR, occurs before the source/drain implants. In this process, the silicon nitride is thick enough to prevent source/drain implant as well as silicide formation.

Non-aligned STI-blocked SCR: First, the SCR bases are defined by the n+ and p+ source/drain (S/D) implants. Second, a layer of silicon nitride or silicon dioxide is patterned to protect the SCR except for fractional surface portions of the SCR anode and cathode. Third, these unprotected portions are silicided.

In both process variations, silicide formation is prevented over the bases of the bipolar elements (pnp and npn transistors). Consequently, electrical shorts between the bases and their corresponding emitters/collectors are prevented.

It is an aspect of the invention to merge an SCR and a MOS transistor by forming only a single well of a conductivity type opposite to the conductivity type of the tank in which the well is embedded. In the example of a p-tank, the well is an n-well and the SCR is pnpn.

Another aspect of the invention is to increase ESD protection by a dual npn structure in the SCR, firstly p-diffusion/n-well/p-tank, and secondly p-diffusion/n-diffusion/p-tank. This dual structure is enabled by the aspect of the invention to use a thick silicon nitride layer as protection of the semiconductor surface regions (base of SCR) from medium-energy n-type ion implantation, thus allowing efficient current flow from p-diffusion to n-diffusion through lightly doped semiconductor material.

Another aspect of the invention is to leave this thick silicon nitride on the SCR for suppressing the silicide formation at the junctions, which would not allow the SCR to trigger before reaching the failure point of the built-in nMOS npn. Taking advantage of the lower breakdown voltage of the junctions initiates the SCR trigger before the avalanche of the high voltage transistor.

Another aspect of the invention is to provide ESD protection for high voltage failsafe applications without bias current and sufficiently low and fast trigger voltage (failsafe I/O circuits are circuits on the bond pad that have no path for dc current regardless whether the device is powered "on" or "off").

Another aspect of the invention is to require fewer ESD resistors for ESD protection than conventional protection circuits. This is an advantage because ESD resistors increase driver size and output capacitance.

Another aspect of the invention is to provide protection compatible with the high voltage transistor junction by integrating the SCR into the device structure of the high voltage transistor structure and designing for a lower breakdown of the SCR.

Another aspect of the invention is to maximize the ESD protection by reducing the shallow trench isolation width spacing the drain of the MOS transistor and the anode of the SCR to zero.

The invention applies to semiconductors both of p-type and n-type as "first" conductivity types. The invention is equally applicable to nMOS and pMOS transistors; the conductivity types of the semiconductor and the ion implant types are simply reversed.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIGS. 10 to 12 are individual process steps applicable to fabricate the first embodiment of the invention; FIGS. 13 to 16 are not applicable for the first embodiment.

FIGS. 13 to 16 are individual process steps applicable to fabricate the second embodiment of the invention; FIGS. 10 to 12 are not applicable for the second embodiment.

DETAILED DESCRIPTION OF THE PREFERRED EMBODIMENTS

Failsafe I/O circuits are traditionally defined as circuits on the bond pad that have no path for dc current regardless whether the device is powered "on" or "off". To create ESD protection under failsafe circuit condition is particularly important for multi-voltage systems that vary I/O operating voltage in order to conserve power.

An additional concern the I/O's should meet for their ESD protection is the amount of output capacitance seen at the bond pad. Since output capacitance restricts the overall bandwidth for bus solutions, I/O interfaces tend to be restrictive on allowable output capacitance. Providing solutions that have less capacitive loading will provide a more successful circuit design.

Another obvious concern is chip real estate area. Although tolerance to higher voltage is gained, drain-extended transistors tend to have lower I-drive compared to their standard transistor counterparts. This implies a disadvantage in the form of chip real estate. Area reduction needs to be leveraged off the intrinsic properties of the drain-extended devices themselves.

For ESD phenomena in drain-extended transistors, the use of an n-well under the drain in nMOS devices allows higher voltage tolerance, but this advantage is off-set by an inefficient lateral npn turn-on with high holding voltage. Consequently, the device ESD performance is poor because of the high power dissipation. Previously proposed improvements include the integration of an SCR (U.S. Pat. No. 5,903,032, issued May 11, 1999, Duvvury, "Power Device Integration for Built-in ESD Robustness"), the application of the gate coupling effect (C. Duvvury et al., "Efficient npn Operation in High Voltage nMOSFET for ESD Robustness", IEDM Digest, 1995), and an n+/p+ design (U.S. Pat. No. 4,939,616, issued Jul. 3, 1990, Rountree, "Circuit Structure with Enhanced Electrostatic Discharge Protection"). These improvements have become more challenging with the recent technical advances of shallow trench isolation (STI), low resistance substrate, and silicided diffusions.

It is of particular interest for the current CMOS technologies, to optimize ESD protection structures by selecting circuit and geometrical designs, such as spacings, to obtain the desired trigger voltage, allow high-voltage circuit operation, and provide ESD robustness. SCR design optimization can thus influence HBM performance.

While the starting material for the device embodiments of the invention is preferably silicon, it may also be silicon germanium, gallium arsenide, or any other semiconductor material used in integrated circuit fabrication.

Figure 1:
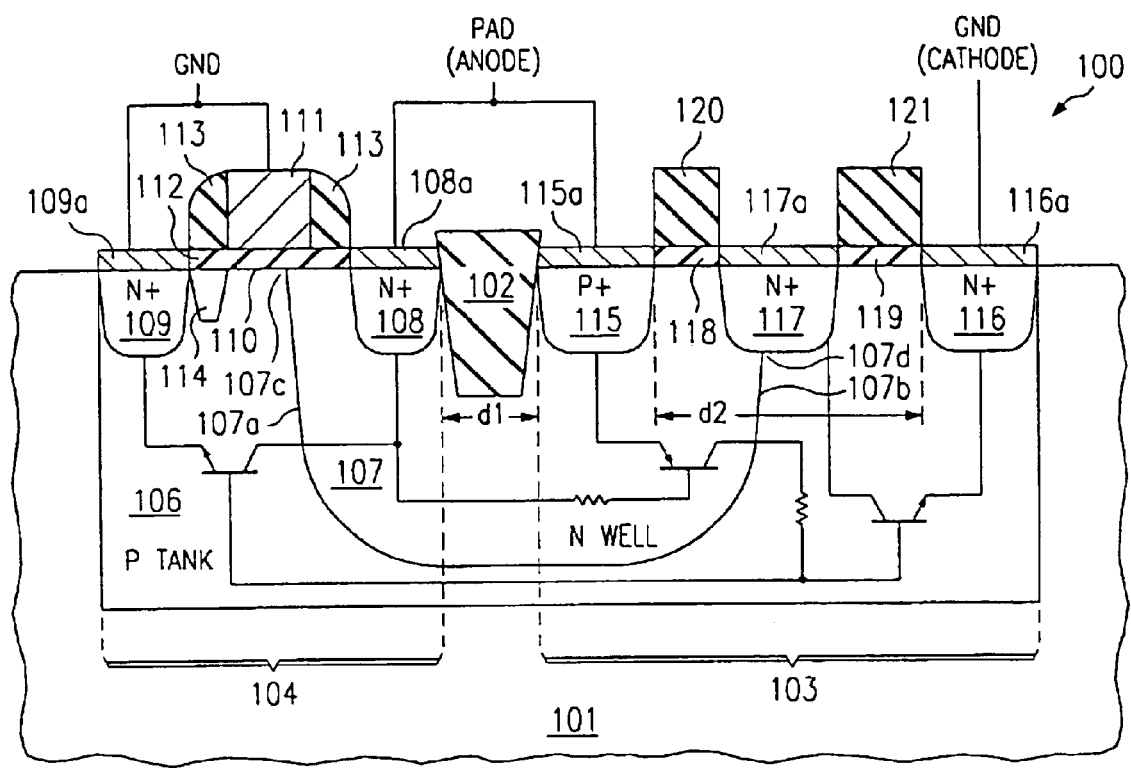
FIG. 1 is a simplified cross section, together with a schematic circuit diagram, of the STI-blocked silicon controlled rectifier merged with the drain expanded MOS transistor according to the first process embodiment of the present invention.

FIG. 1 shows a simplified cross section together with a schematic circuit diagram of the first preferred embodiment, generally designated 100, of the present invention. In the example of FIG. 1, the conductivity of the semiconductor substrate 101 is p-type. It should be stressed, however, that all considerations remain valid for the opposite conductivity; consequently, the semiconductor substrate could be n-type. The p-doping species are selected from a group consisting of boron, aluminum, gallium, and indium. The n-doping species are selected from arsenic, phosphorus, antimony, and bismuth.

A non-conductive isolation region 102, inserted in the p-type semiconductor as a shallow trench isolation STI, defines the lateral boundaries of the active areas of the silicon controlled rectifier (SCR) 103 and the drain extended MOS (DE-MOS) transistor 104. The width of the STI region 102 is selected from a value between 0.6 and 0.2 $\mu$m, or zero $\mu$m. The first embodiment 100 is characterized by the process flow (discussed below) providing a "self-aligned STI-blocked SCR" (SBSCR).

Into the surface of the p-type semiconductor has been fabricated a p-tank 106; its resistivity range is about 1 to 50 $\Omega$cm. Nested in this p-tank is an n-well 107. This nested configuration of the n-well creates side walls 107a and 107b with the p-tank. Side wall 107a, located in the device portion of the MOS transistor intersects the surface at line 170c. Side wall 107d, located in the device portion of the SCR intersects one n+ diffusion of the npn transistor of the SCR at line 107d.

Referring further to the embodiment of FIG. 1 and its choice of conductivity types, the n+ drain region 108 of the MOS transistor, is located in the n-well 107. The n+ source region 109 is located in p-tank 106 and separated from the n-well 107 by a channel region 110 in the p-tank 106. Extending over channel region 110 is transistor gate 111, made of poly-silicon or other conductive material. Gate 111 is separated from channel region 110 by insulating material 112, which is suitable as gate dielectric; a preferred material is silicon dioxide. Gate 111 has a narrow dimension from about 0.2 to 1.0 $\mu$m. The thickness of gate oxide 112 is preferably between 2 and 10 nm. Gate 111 is surrounded by protecting insulating material 113 such as silicon nitride. Gate 111 is electrically connected to source 109 and ground potential. The lightly n-doped drain 114 extends from source 109 towards gate 111.

The ground potential of source region 109 provides a secondary cathode. This feature improves the ESD protection efficiency of the device 100.

As FIG. 1 shows, the SCR 103 is merged with the drain extended MOS transistor 104 into p-tank region 106 and a second portion of the n-well 107. The p+ anode 115 of the SCR is fully located in the n-well 107. Anode 115 is geometrically spaced from drain 108 by the trench isolation 102, but is electrically connected to the drain. The n+ cathode region is located in the p-tank; it is electrically connected to ground potential. The other n+ region 117 of the npn transistor of the SCR is positioned between the anode 115 and cathode 116 such that one portion of region 117 is located in p-tank 106, creating an abrupt junction, and the other portion is located in n-well 107. (As stated above, side wall 107b of the n-well intersects diffusion region 117 at line 107d). Based on this arrangement, region 117 is resistively coupled by the n-well 107 to the drain 108 of the MOS transistor. Electrically, region 117 is referred to as a "floating" region.

Due to the abrupt junction of floating region 117, the "trigger diffusion", with p-tank 106, this region is configured to provide an electrical breakdown of region 117 to p-tank 106 as the trigger mechanism of the SCR 103. The trigger mechanism is achieved prior to the breakdown of the drain 108 of the MOS transistor. This trigger of the SCR provides an ESD protection tolerant for high voltage operation while consuming minimum device area and avoiding any risk of gate oxide damage.

In the embodiment of FIG. 1, the spacing region between anode 115 and diffusion region 117 has insulating material 118 on its surface, made of the same material as gate insulator 112. Likewise, the spacing region between diffusion region 117 and cathode 116 has insulating material 119 on its surface. Over both insulating materials 118 and 119 are insulating layers, designated 120 and 121 respectively. These layers have a thickness in the range from about 80 to 150 nm, and are selected from a group consisting of silicon nitride, silicon dioxide, silicon oxynitride, polyimide, and stacked layers thereof. Layers 120 and 121 are thus suitable for high voltage device operation, and capable to protect the spacing regions underneath from medium energy p-type ion implantation.

In terms of geometry, the channel length of channel region 110 of the drain extended MOS transistor 104 is greater than the semiconductor spacings between floating region 117 and anode 115, and floating region 117 and cathode 116 of SCR 103.

As FIG. 1 shows, source 109, drain 108, anode 115, floating region 117, and cathode 116 have silicided surfaces 109a, 108a, 115a, 117a, and 116a, respectively.

Figure 2:
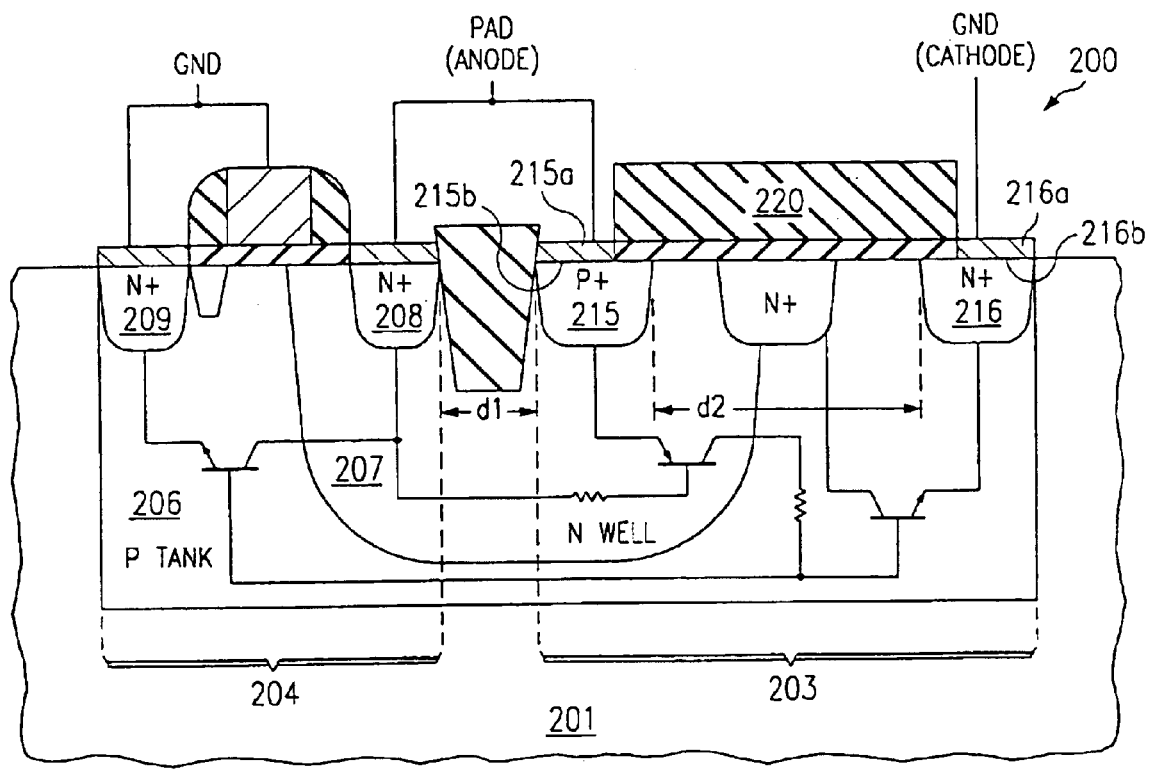
FIG. 2 is a simplified cross section, together with a schematic circuit diagram, of the STI-blocked silicon controlled rectifier merged with the drain expanded MOS transistor according to the second process embodiment of the present invention.

FIG. 2 shows a simplified cross section together with a schematic circuit diagram of the second preferred embodiment, generally designated 200, of the present invention. The second embodiment 200 is characterized by the process flow (discussed below) providing a "non-aligned STI-blocked SCR" 203. In the example of FIG. 2, the conductivity of the semiconductor substrate 201 is p-type. It should be stressed, however, that all considerations remain valid for the opposite conductivity; consequently, the semiconductor substrate could be n-type.

The design and material features of the p-tank 206, the n-well 207, and the drain extended MOS transistor 204 are analogous to the respective features discussed in FIG. 1. The STI-blocked SCR 203, however, shows significant differences. The dielectric material 220, including silicon nitride or silicon dioxide, overlays the whole surface of the SCR except for a fractional surface portion 215b of anode 215 and a fractional surface portion 216b of cathode 216. These fractional surface portions are silicided (215a and 216a, respectively). The process flow required for the structure of FIG. 2 is described below.

The electrical connections of the structure depicted in FIG. 2 are the same as the connections in FIG. 1. Consequently, the silicided surface fraction 215b of anode 215 is connected to the drain 208 of the drain extended MOS transistor 204, and the silicided surface fraction 216b of cathode 216 is connected to ground, as is the source 209 of transistor 204.

The first embodiment of the present invention in FIG. 1, as well as the second embodiment in FIG. 2, achieve efficient SCR action for advanced CMOS technologies by blocking the STI. In order to integrate this requirement with the low-voltage LDD/silicide process, nitride masks in the SCR process are needed. For the first embodiment (FIG. 1), the silicide block process step is performed before source/drain (S/D) implant. The silicon nitride of the silicide-block mask is thick enough to prevent S/D implant as well as silicide formation. This feature allows the blocking of silicide and S/D implant to be "self-aligned". In the absence of STI and STI-block, all diffusions in FIG. 1 are silicided. Effective npn and pnp transistors, with sufficiently low leakage currents, can be created without STI between the anode and cathode.

The second embodiment in FIG. 2 creates the same characteristics as described above by performing the S/D implant before the silicide block process step employing an additional process step (see below) and a modified silicon nitride (220 in FIG. 2).

The circuit layouts in FIGS. 1 and 2 illustrate the triggering mechanism of the SCR. In addition, two geometrical variables d1 and d2 are shown which are available for optimization in order to achieve best electrical performance. d1 relates to the width of the STI; d2 is the total anode-cathode spacing. These variables are depicted in more detail in FIG. 3 together with a number of other dimensions of SCR spacings essential for ESD optimization. Parameters b, c, d, x relate to the SCR trigger behavior, parameter d1 to the investigation of the dual SCR phenomenon due to the secondary cathode. The guidelines for selecting the variable values and reveal their interdependencies are:

Vary spacing "x" to study effect on trigger voltage;
Vary spacing "d1" to quantify dual SCR effect;
Monitor leakage with self-aligned SB-SCR.

Figure 3:
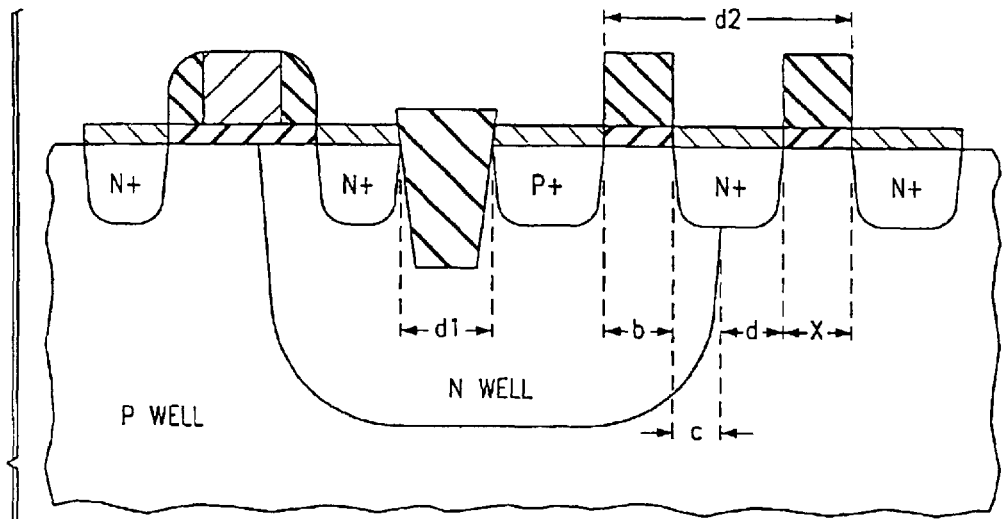
FIG. 3 shows several structural device dimensions investigated in order to optimize the ESD impact of the invention.

The Table of FIG. 3 lists an example of experimental results. ESD2 is the control device.

Referring to the Table in FIG. 3, it lists various combinations of the geometrical parameters and the resulting trigger voltage and failure current It2; the data were collected with 100 ns pulse system. ESD1 has the shortest dimension for x, and correspondingly the lowest trigger voltage. ESD6 has the largest dimension for x, and the largest anode-to-cathode spacing; the beneficial effect on the trigger voltage is obvious. As the Table demonstrates, the dimension x controls the trigger voltage since it determines the npn trigger. On the other hand, ESD3 shows the highest failure-current It2.

Figures 4A, 4B, 4C, 4D:
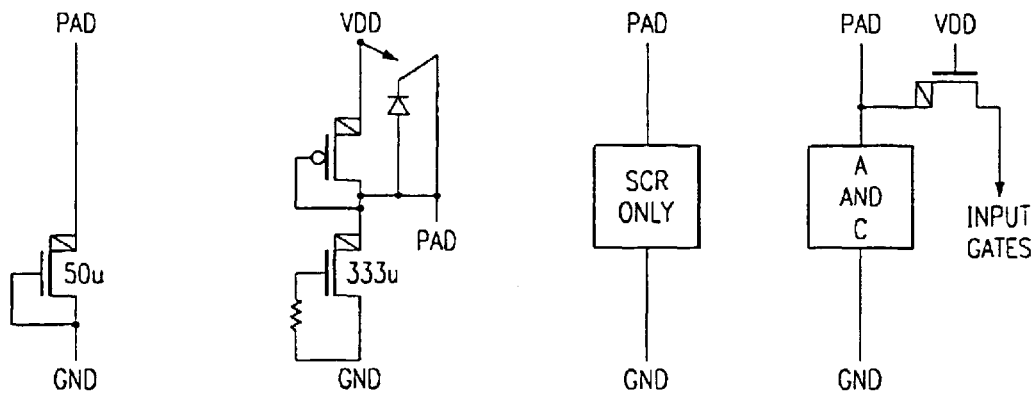
FIG. 4 (FIGS. 4A to 4D) depicts the schematic circuit diagrams of the arrangements from which the I–V characteristics of FIG. 3 are measured.
Figure 5:
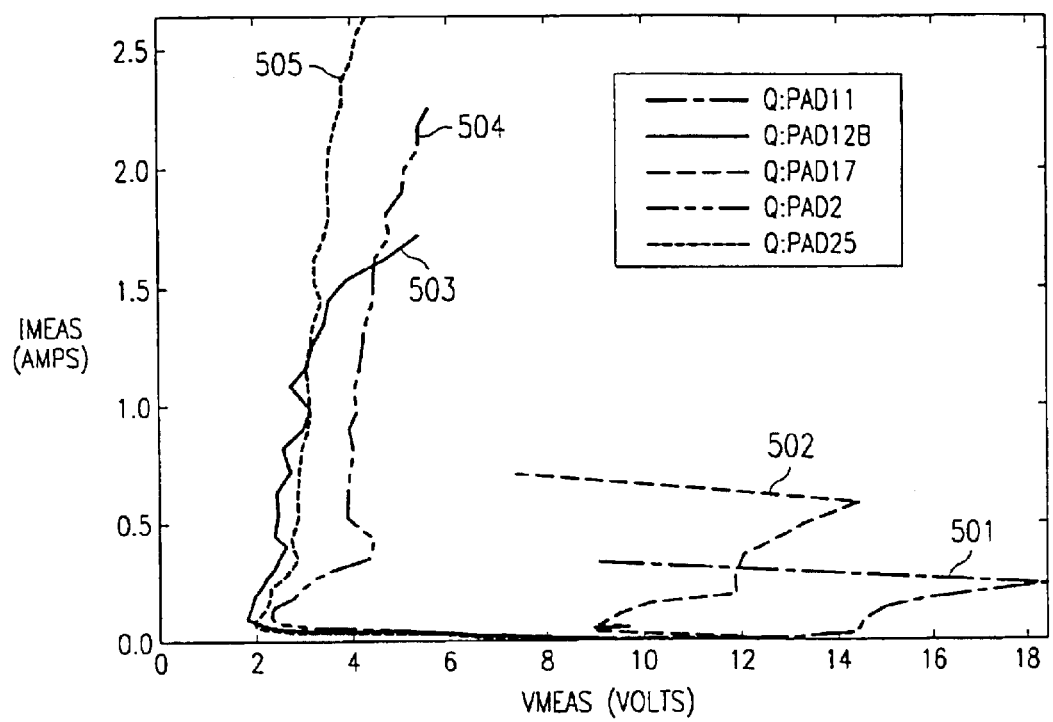
FIG. 5 compares the I–V characteristic of a device having the benefit of the invention with I–V characteristics of devices without the benefit of the invention.

In order to illustrate the improved ESD performance due to the invention, FIGS. 4 and 5 compare different architectural configurations (FIG. 4) and their resulting current/voltage device characteristics (FIG. 5, current measured in A, voltage measured in V) for I/O protection applications (200 ns pulse system).

FIG. 4A; FIG. 5, curve 501:
Stand-alone grounded gate DE-nMOS. Experimental: Gate 50 μm wide, Leff=0.64 μm.
Result: The grounded gate DE-nMOS does not show any snapback. Low failure current.

FIG. 4B; FIG. 5, curve 502:
Large DE-nMOS/pMOS failsafe output with no SCR protection. Experimental: 333 μm wide DE-pMOS with blocked back-gate diode; 333 μm wide DE-nMOS with typical pre-drivers connected to their gates.
Result: The large DE output structure shows some initial npn snapback because of the gate coupling effect. Low failure current.

FIG. 4C; FIG. 5, curve 503:
Result: Shows breakdown at about 8 V. The trigger of Stand-alone SB-SCR. Experimental: 50 μm wide. the SCR with a moderate on-resistance and failure at a current level in proportion to the pulse is observed.

FIG. 4D; FIG. 5, curve 504:
Integrated SB-SCR with 50 μm grounded gate DE-nMOS with input (combination of FIGS. 4A and 4C).
Experimental: 5 μm wide DE-nMOS pass-gate to internal gates.
Result: Triggers at 8.5 V well before the DE-nMOS and thus protect the DE-nMOS. Improvement over curve 503 indicated by the lower on-resistance.

Combination of FIGS. 4B and 4C; FIG. 5, curve 505:
Integrated SB-SCR with 50 μm grounded gate DE-nMOS.
Result: The combination of the integrated SB-SCR with a failsafe output with blocked back-gate diode shows an even greater ESD performance. The gate coupling of the large DE-nMOS (333 μm wide) acting in parallel with the integrated SB-SCR shows improved failure current over the stand-alone device FIG. 4C; FIG. 5, curve 503).

Figure 8:
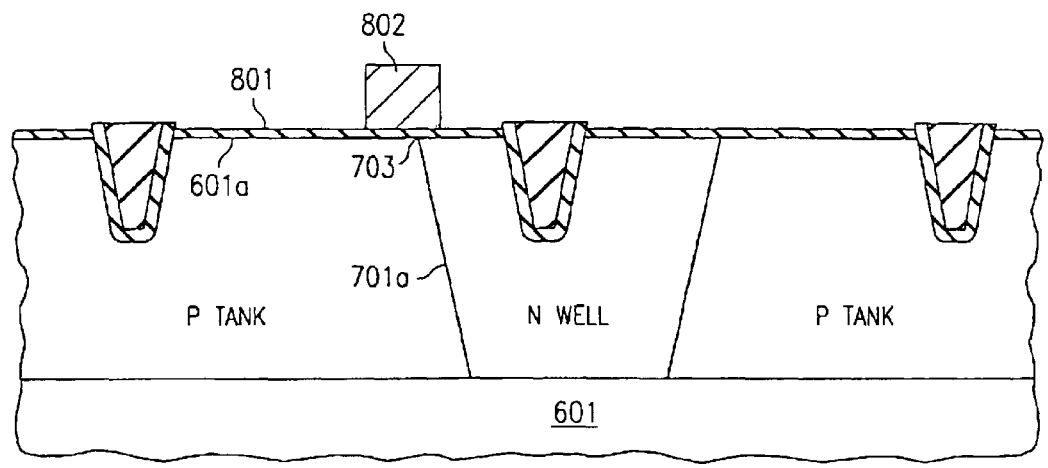
Figure 9:
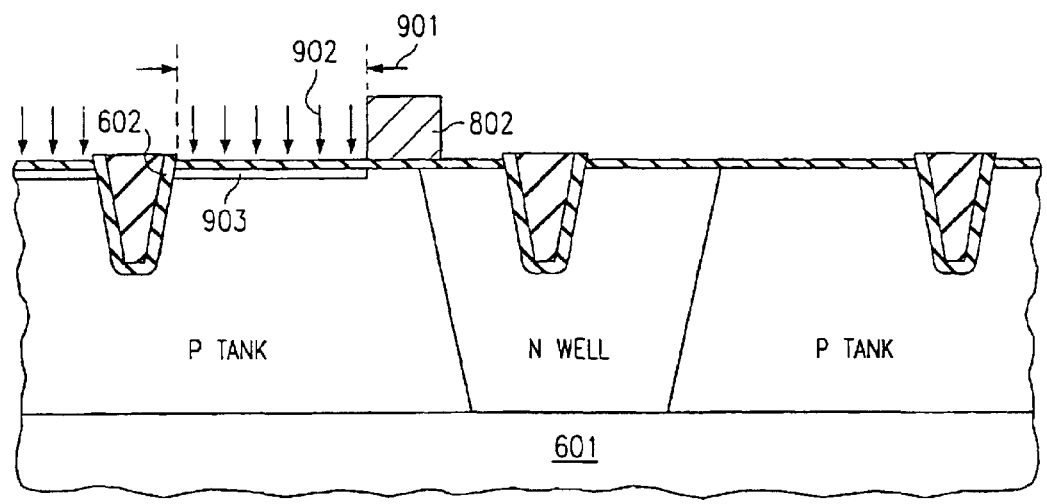
Figure 10:
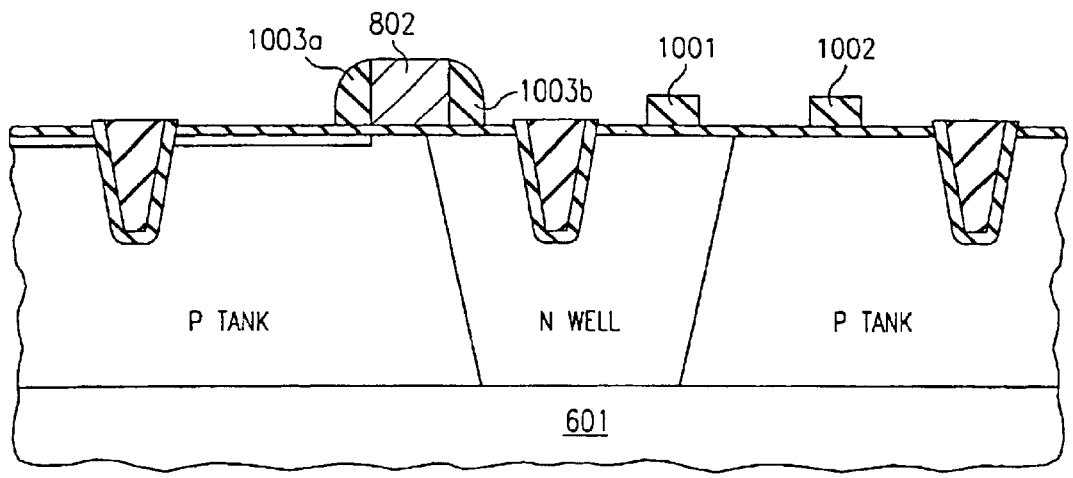
Figure 11:
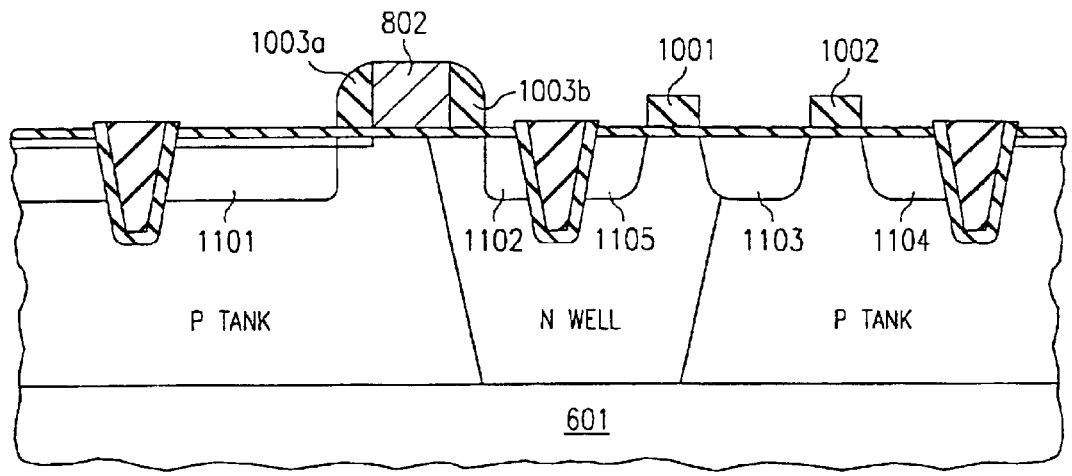
Figure 12:
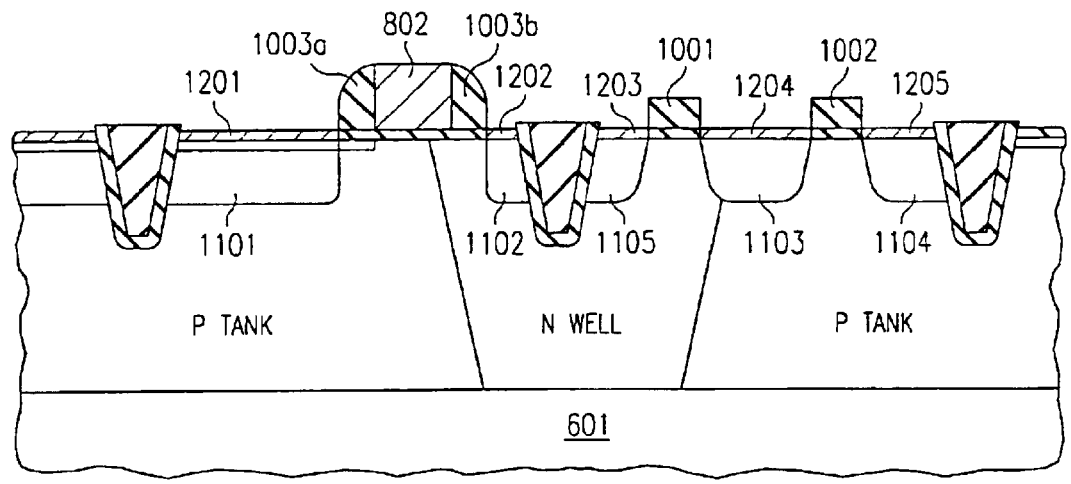

FIGS. 6 to 16 describe the process flow for fabricating a SCR merged with a drain extended MOS device according to the invention. The process flow is illustrated for two embodiments; FIGS. 6 to 9 apply to both flows. However, FIGS. 10 to 12 are the continued flow for the first embodiment of the invention, while FIGS. 13 to 16 apply to the second embodiment. The process flows are described for p-type semiconductor material as starting material, pnpn SCR, and nMOS transistor. It should be stressed, however, that an analogous process flow description holds for n-type starting material, npnp SCR and pMOS transistor, since the invention applies to both p-type and n-type material as first conductivity type. The p-type semiconductor has a peak doping concentration between 4·10E17 and 1·10E18 cm-3 after background doping adjustment implant.

Figure 6:
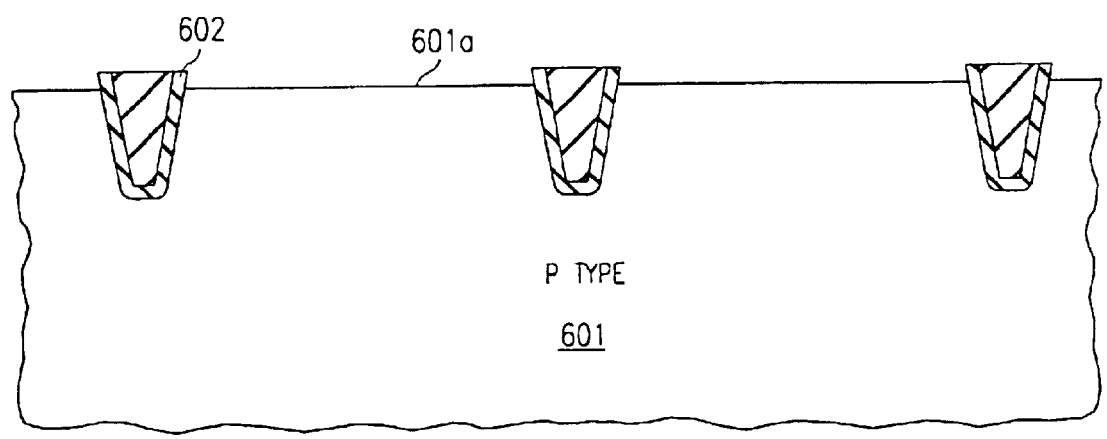
FIGS. 6 to 16 are schematic and simplified cross sections of the semiconductor surface portion illustrating individual process steps in the fabrication flow of the ESD protection circuit according to the invention.
Figure 7:
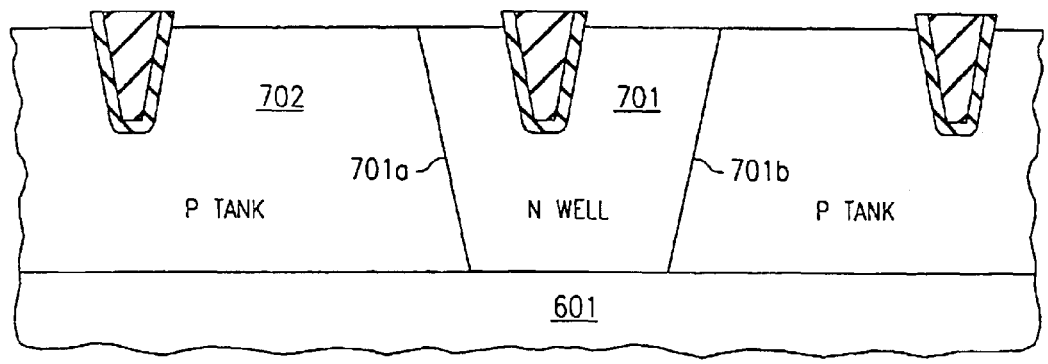

FIG. 6: Forming non-conductive isolation regions 602 into the surface 601a of p-type semiconductor 601 for defining the lateral boundaries of the active areas of the MOS transistor and the SCR;

FIG. 7: Implanting n-doping ions into the p-type semiconductor 601 to form an n-well 701 having side walls 701a and 701b;

implanting p-doping ions into said p-type semiconductor 601 surrounding said n-well side walls to form a p-tank 702;

FIG. 8: Depositing over the surface 601a a layer 801 of insulating material suitable as gate dielectric, thereby covering said SCR and transistor areas;

depositing a layer of poly-silicon or other conductive material onto insulating layer 801;

protecting a portion of the poly-silicon and etching the remainder thereof, thereby defining the gate area 802 of the transistor at the location 703 where the n-well side wall 701a intersects the surface 601a;

FIG. 9: Depositing a first photoresist layer and opening a window 901 therein, thereby exposing the surface of the p-tank area adjacent said poly-silicon gate 802;

implanting, at low energy, low dose n-doping ions 902 into said exposed surface area, thereby creating shallow, lightly n-doped layers 903 under said surface; the energy of the ions is suitable for creating the junction at a depth between 10 and 50 nm, and the peak concentration is from about $5 \cdot 10E17$ to $5 \cdot 10E20$ cm-3;

removing the first photoresist layer;

FIG. 10: Depositing a conformal layer of dielectric material including silicon nitride or silicon dioxide over the surface;

forming a second patterned photoresist layer to protect portions of the dielectric layer defining the bases 1001 and 1002 of the pnp and the npn portions of the SCR;

directional plasma etching the dielectric layer so that the only remaining dielectric forms side walls 1003a and 1003b around the poly-silicon gate 802 and covers the extent of the base space charge regions of the transistor;

removing said second photoresist layer;

FIG. 11: Forming a third patterned photoresist layer to protect a portion of the surface defining the anode of the SCR;

implanting, at medium energy, n-doping ions into the surface, thereby creating n-doped regions that extend to a medium depth under the surface, suitable as deep source (1101 in FIG. 11) and drain (1102) of the transistor and as npn portions (1103 and 1104) of the SCR; the energy of the ions is suitable for creating the junction at a depth between 50 and 200 nm, and the peak concentration is from about $5 \cdot 10E19$ to $5 \cdot 10E20$ cm-3;

removing said third photoresist layer;

depositing a fourth photoresist layer and opening a window therein, thereby exposing the surface of the anode of the pnp portion of the SCR;

implanting, at medium energy and high dose, p-doping ions into the window, thereby creating a p-doped region (1105 in FIG. 11) at medium depth, suitable as anode of the SCR; the energy of the ions is suitable for creating the junction at a depth between 50 and 200 nm, and the peak concentration is from about $5 \cdot 10E19$ to $5 \cdot 10E20$ cm-3;

removing the fourth photoresist layer;

FIG. 12: Removing the exposed gate dielectric; and siliciding the freshly etched surfaces (1201 in FIG. 12, 1202, 1203, 1204, and 1205), thereby forming silicides only on the medium doped silicon regions.

The process flow for the second embodiment of the invention starts in FIG. 6, continues through FIG. 9, and then continues from FIG. 13 through 16.

Figure 13:
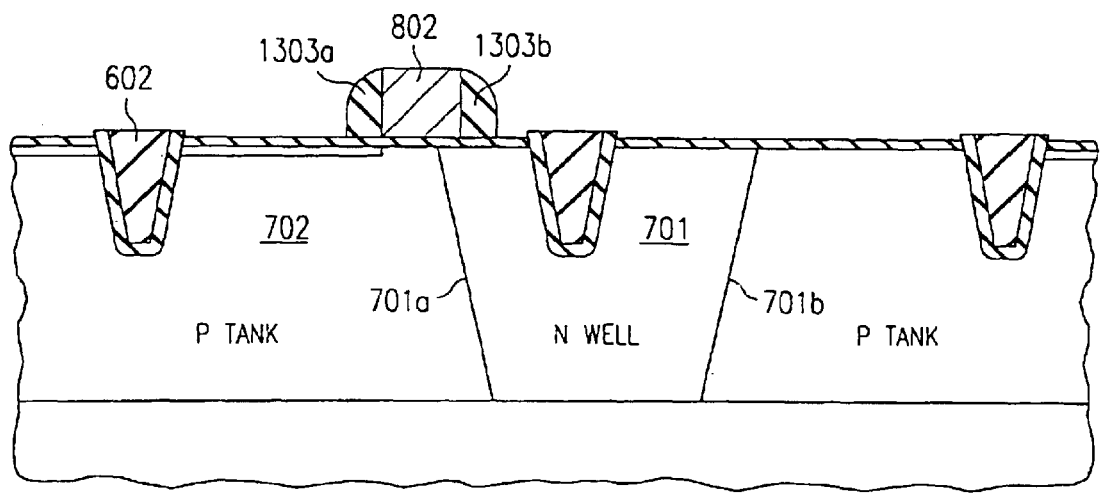
Figure 14:
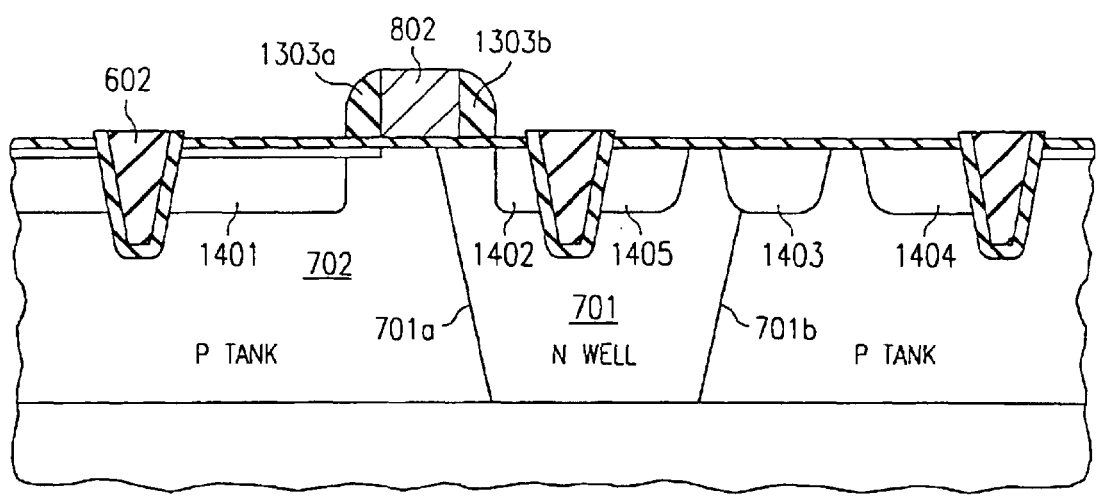
Figure 15:
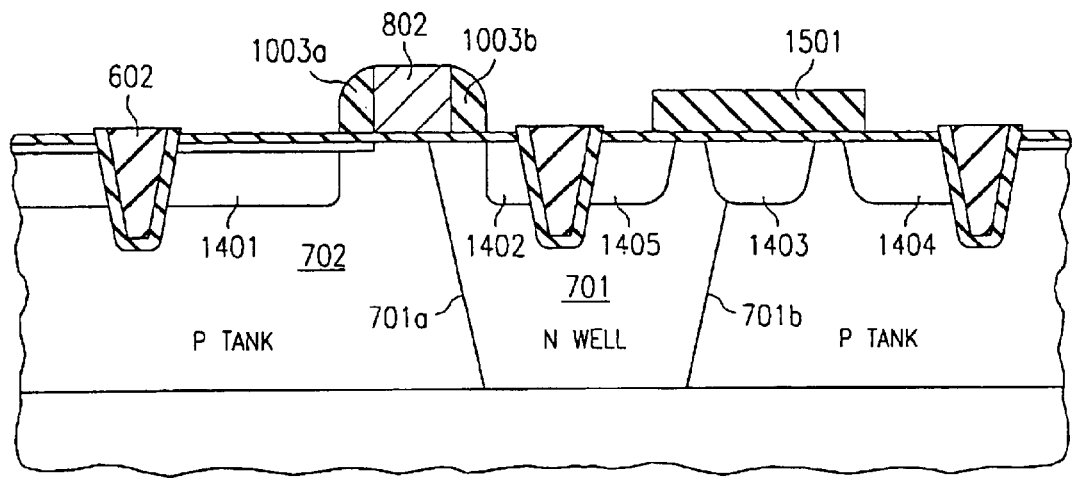

FIG. 13: Depositing a first conformal layer of dielectric material including silicon nitride or silicon dioxide over the surface;

directional plasma etching the first dielectric layer so that the only remaining dielectric forms side walls 1303a and 1303b around the poly-silicon gate 802 and covers the extent of the base space charge regions of the transistor;

FIG. 14: Forming a second patterned photoresist layer to protect a portion of the surface, defining the anode of the SCR;

implanting, at medium energy, n-doping ions into the surface, thereby creating n-doped regions that extend to a medium depth under the surface, suitable as deep source 1401 and drain 1402 of the transistor and the npn portions 1403 and 1404 of the SCR; the energy of the ions is suitable for creating the junction at a depth between 50 and 200 nm, and the peak concentration is from about $5 \cdot 10E19$ to $5 \cdot 10E20$ cm-3;

removing the second photoresist layer;

depositing a third photoresist layer and opening a window therein, thereby exposing the surface of the anode of the pnp portion of the SCR;

implanting, at medium energy and high dose, p-doping ions into the window, thereby creating a p-doped region 1405 at medium depth, suitable as anode of the SCR; the energy of the ions is suitable for creating the junction at a depth between 50 and 200 nm, and the peak concentration is from about $5 \cdot 10E19$ to $5 \cdot 10E20$ cm-3;

removing said the photoresist layer;

FIG. 15: Depositing a second conformal layer of dielectric material including silicon nitride or silicon dioxide over the surface;

forming a fourth patterned photoresist layer to protect a portion of the second dielectric layer defining the SCR except for fractional surface portions of the anode and cathode;

removing the second dielectric layer except for the photoresist-protected portion 1501, referred to as "silicide block mask";

removing the fourth photoresist layer; and

Figure 16:
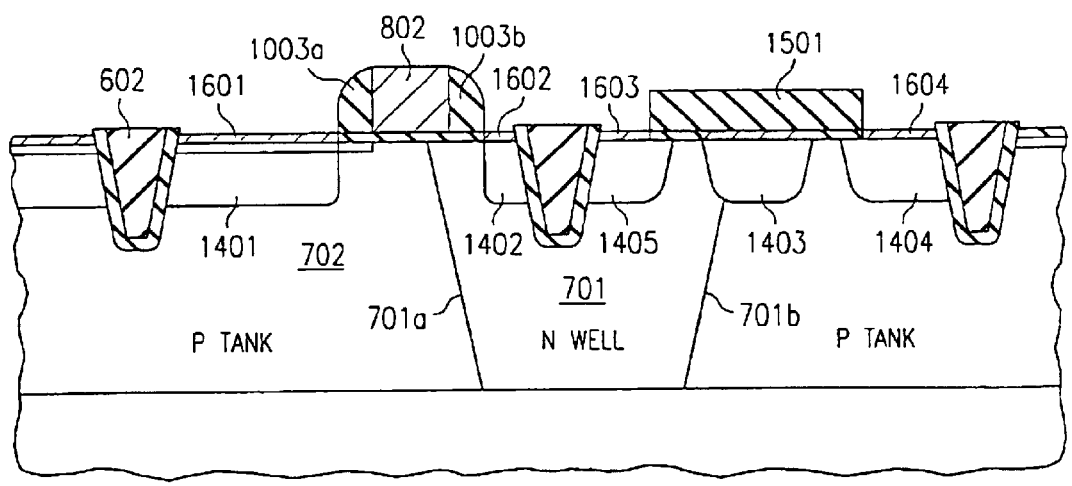

FIG. 16: Siliciding the freshly etched surfaces 1601, 1602, 1603, and 1604, including the fractional anode and cathode surface portions (1603 and 1604 respectively), thereby leaving the dielectric-protected surface areas of the SCR (areas under layer 1501) silicide-blocked.

For fabricating a pMOS transistor according to the method of the present invention, the flow of the above process steps applies in analogous fashion with a reversal of conductivity types.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method of fabricating into the surface of a n-well, having first and second side-walls in a p-tank, a pnpn SCR integrated with a drain-extended nMOS transistor for multi-voltage operation having built-in ESD protection, said surface having a layer of insulating material suitable as gate dielectric and a poly-silicon gate deposited on said insulating layer at the location where said first side-wall intersects said surface, comprising the steps of:

depositing a first photoresist layer and opening a window therein, thereby exposing the surface of said p-tank area adjacent said poly-silicon gate and covering said n-well and said p-tank adjacent said second side-wall;

implanting, at low energy and low dose, n-doping ions into said exposed surface area, thereby creating shallow, lightly n-doped layers under said surface and leaving the area under the photoresist unimplanted;

removing said first photoresist layer;

depositing a conformal layer of dielectric material including silicon nitride or silicon dioxide over said surface;

forming a second patterned photoresist layer to protect portions of said dielectric layer defining the bases of the pnp and the npn portions of said SCR;

directional plasma etching said dielectric layer so that the only remaining dielectric forms side walls around said poly-silicon gate and covers the extent of the base space charge regions of said transistor;

removing said second photoresist layer;

forming a third patterned photoresist layer to protect a portion of said surface defining the anode of said SCR;

implanting, at medium energy, n-doping ions into said surface, thereby creating n-doped regions that extend to a medium depth under said surface, suitable as deep source and drain of said transistor and as npn portion of said SCR, the junction of one of said SCR n-regions partially formed with said p-tank and partially with said n-well;

removing said third photoresist layer;

depositing a fourth photoresist layer and opening a window therein, thereby exposing the surface of said anode of said pnp portion of said SCR;

implanting, at medium energy and high dose, p-doping ions into said window, thereby creating a p-doped region at medium depth, suitable as anode of said SCR; and removing said fourth photoresist layer.

2. A method of fabricating into the surface of a p-type semiconductor a pnpn silicon controlled rectifier (SCR) integrated with a drain-extended nMOS transistor for multi-voltage operation having built-in ESD protection, comprising the steps of:

forming non-conductive isolation regions into said p-type semiconductor for defining the lateral boundaries of the active areas of said MOS transistor and said SCR;

implanting n-doping ions into said p-type semiconductor to form an n-well having side walls;

implanting p-doping ions into said p-type semiconductor surrounding said n-well side walls to form a p-tank;

depositing over said surface a layer of insulating material suitable as gate dielectric, thereby covering said SCR and transistor areas;

depositing a layer of poly-silicon or other conductive material onto said insulating layer;

protecting a portion of said poly-silicon and etching the remainder thereof, thereby defining the gate area of said transistor at the location where said n-well side wall intersects said surface;

depositing a first photoresist layer and opening a window therein, thereby exposing the surface of said p-tank area adjacent said poly-silicon gate;

implanting, at low energy, low dose n-doping ions into said exposed surface area, thereby creating shallow, lightly n-doped layers under said surface;

removing said first photoresist layer;

depositing a conformal layer of dielectric material including silicon nitride or silicon dioxide over said surface;

forming a second patterned photoresist layer to protect portions of said dielectric layer defining the bases of the pnp and the npn portions of said SCR;

directional plasma etching said dielectric layer so that the only remaining dielectric forms side walls around said poly-silicon gate and covers the extent of the base space charge regions of said transistor;

removing said second photoresist layer;

forming a third patterned photoresist layer to protect a portion of said surface defining the anode of said SCR;

implanting, at medium energy, n-doping ions into said surface, thereby creating n-doped regions that extend to a medium depth under said surface, suitable as deep source and drain of said transistor and as npn portions of said SCR;

removing said third photoresist layer;

depositing a fourth photoresist layer and opening a window therein, thereby exposing the surface of said anode of said pnp portion of said SCR;

implanting, at medium energy and high dose, p-doping ions into said window, thereby creating a p-doped region at medium depth, suitable as anode of said SCR;

removing said fourth photoresist layer; and removing said exposed gate dielectric and siliciding the freshly etched surfaces, thereby forming silicides only on the medium doped silicon regions.

3. The method according to claim 2 wherein said step of forming non-conductive isolation regions is modified by not forming said isolation region between said drain of said transistor and said anode of said rectifier.

4. The method according to claim 2 wherein the thickness of said first photoresist layer is larger than a thickness solely required to block said low-energy ion implant.

5. The method according to claim 2 wherein said p-type semiconductor has a peak doping concentration between $4 \cdot 10E17$ and $1 \cdot 10E18$ cm-3 after said background doping adjustment implant.

6. The method according to claim 2 wherein said implanting of low energy ions comprises ions having an energy suitable for creating the junction at a depth between 10 and 50 nm, and a peak concentration from about $5 \cdot 10E17$ to $5 \cdot 10E20$ cm-3.

7. The method according to claim 2 wherein said implanting of medium energy ions comprises ions having an energy suitable for creating the junction at a depth between 50 and 200 nm, and a peak concentration from about $5 \cdot 10E19$ to $5 \cdot 10E20$ cm-3.

8. A method of fabricating into the surface of a p-well, having first and second side-walls in a n-tank, a npnp SCR integrated with a drain-extended pMOS transistor for multi-voltage operation having built-in ESD protection, said surface having a layer of insulating material suitable as gate dielectric and a poly-silicon gate deposited on said insulating layer at the location where said first side wall intersects said surface, comprising the steps of:

depositing a first photoresist layer and opening a window therein, thereby exposing the surface of said n-tank area adjacent said poly-silicon gate and covering said p-well and said n-tank adjacent said second side-wall;

implanting, at low energy and low dose, p-doping ions into said exposed surface area, thereby creating shallow, lightly p-doped layers under said surface and leaving the area under the photoresist unimplanted;

removing said first photoresist layer;

depositing a conformal layer of dielectric material including silicon nitride or silicon dioxide over said surface;

forming a second patterned photoresist layer to protect portions of said dielectric layer defining the bases of the npn and pnp portions of said SCR;

directional plasma etching said dielectric layer so that the only remaining dielectric forms side walls around said poly-silicon gate and covers the extent of the base space charge regions of said transistor;

removing said second photoresist layer;

forming a third patterned photoresist layer to protect a portion of said surface defining the anode of said SCR;

implanting, at medium energy, p-doping ions into said surface, thereby creating p-doped regions that extend to a medium depth under said surface, suitable as deep source and drain of said transistor and as pnp portion of said SCR, the junction of one of said SCR p-regions partially formed with said n-tank and partially with said p-well;

removing said third photoresist layer;

depositing a fourth photoresist layer and opening a window therein, thereby exposing the surface of said anode of said npn portion of said SCR;

implanting, at medium energy and high dose, n-doping ions into said window, thereby-creating a n-doped region at medium depth, suitable as anode of said SCR; and removing said fourth photoresist layer.

9. A method of fabricating into the surface of a n-type semiconductor a npnp SCR integrated with a drain-extended pMOS transistor for multi-voltage operation having built-in ESD protection, comprising the steps of:

forming non-conductive isolation regions into said n-type semiconductor for defining the lateral boundaries of the active areas of said MOS transistor and said SCR;

implanting p-doping ions into said n-type semiconductor to form an p-well having side walls;

implanting n-doping ions into said n-type semiconductor surrounding said p-well side walls to form a n-tank;

depositing over said surface a layer of insulating material suitable as gate dielectric, thereby covering said SCR and transistor areas;

depositing a layer of poly-silicon or other conductive material onto said insulating layer;

protecting a portion of said poly-silicon and etching the remainder thereof, thereby defining the gate area of said transistor at the location where said p-well side wall intersects said surface;

depositing a first photoresist layer and opening a window therein, thereby exposing the surface of said n-tank area adjacent said poly-silicon gate;

implanting, at low energy, low dose p-doping ions into said exposed surface area, thereby creating shallow, lightly p-doped layers under said surface;

removing said first photoresist layer;

depositing a conformal layer of dielectric material including silicon nitride or silicon dioxide over said surface;

forming a second patterned photoresist layer to protect portions of said dielectric layer defining the bases of the npn and pnp portions of said SCR;

directional plasma etching said insulating layer so that the only remaining dielectric forms side walls around said poly-silicon gate and covers the extent of the base space charge regions of said transistor;

removing said second photoresist layer;

forming a third patterned photoresist layer to protect a portion of said surface defining the anode of said SCR;

implanting, at medium energy, p-doping ions into said surface, thereby creating p-doped regions that extend to a medium depth under said surface, suitable as deep source and drain of said transistor and as pnp portions of said SCR;

removing said third photoresist layer;

depositing a fourth photoresist layer and opening a window therein, thereby exposing the surface of said cathode of said npn portion of said SCR;

implanting, at medium energy and high dose, n-doping ions into said window, thereby creating a n-doped region at medium depth, suitable as cathode of said SCR;

removing said fourth photoresist layer; and removing said exposed gate dielectric; and siliciding the freshly etched surfaces, thereby forming silicides only on the medium doped silicon regions.

10. The method according to claim 9 wherein said step of forming non-conductive isolation regions is modified by not forming said isolation region between said drain of said transistor and said anode of said rectifier.

11. The method according to claim 9 wherein the thickness of said first photoresist layer is larger than a thickness solely required to block said low-energy ion implant.

12. The method according to claim 9 wherein said n-type semiconductor has a peak doping concentration between $4 \cdot 10E17$ and $1 \cdot 10E18$ cm-3 after said background doping adjustment implant.

13. The method according to claim 9 wherein said implanting of low energy ions comprises ions having an energy suitable for creating the junction at a depth between 10 and 50 nm, and a peak concentration from about $5 \cdot 10E17$ to $5 \cdot 10E20$ cm-3.

14. The method according to claim 9 wherein said implanting of medium energy ions comprises ions having an energy suitable for creating the junction at a depth between 50 and 200 nm, and a peak concentration from about $5 \cdot 10E19$ to $5 \cdot 10E20$ cm-3.

15. A method of fabricating into the surface of a n-well, having first and second side-walls in a p-tank, a pnpn SCR integrated with a drain-extended nMOS transistor for multi-voltage operation having built-in ESD protection, said surface having a layer of insulating material suitable as gate dielectric and a poly-silicon gate deposited on said insulating layer at the location where said first side-wall intersects said surface, comprising the steps of:

depositing a first photoresist layer and opening a window therein, thereby exposing the surface of said p-tank area adjacent said poly-silicon gate and covering said n-well and said p-tank adjacent said second side-wall;

implanting, at low energy and low dose, n-doping ions into said exposed surface area, thereby creating shallow, lightly n-doped layers under said surface and leaving the area under the photoresist unimplanted;

removing said first photoresist layer;

depositing a first conformal layer of dielectric material including silicon nitride or silicon dioxide over said surface;

directional plasma etching said first dielectric layer so that the only remaining dielectric forms side walls around said poly-silicon gate and covers the extent of the base space charge regions of said transistor;

forming a second patterned photoresist layer to protect a portion of said surface defining the anode of said SCR;

implanting, at medium energy, n-doping ions into said surface, thereby creating n-doped regions that extend to a medium depth under said surface, suitable as deep source and drain of said transistor and said npn portions of said SCR;

removing said second photoresist layer;

depositing a third photoresist layer and opening a window therein, thereby exposing the surface of said anode of said pap portion of said SCR;

implanting, at medium energy and high dose, p-doping ions into said window, thereby creating a p-doped region at medium depth, suitable as anode of said SCR;

removing said third photoresist layer;

depositing a second conformal layer of dielectric material including silicon nitride or silicon dioxide over said surface;

forming a fourth patterned photoresist layer to protect a portion of said conformal layer defining said SCR except for fractional surface portions of said anode and cathode;

removing said second dielectric layer except for said photoresist-protected portion;

removing said fourth photoresist layer; and siliciding the freshly etched surfaces, including said fractional anode and cathode surface portions, thereby leaving the dielectric-protected surface areas of said SCR silicide-blocked.

16. A method of fabricating into the surface of a p-type semiconductor a pnpn SCR integrated with a drain-extended nMOS transistor for multi-voltage operation having built-in ESD protection, comprising the steps of:

forming non-conductive isolation regions into said p-type semiconductor for defining the lateral boundaries of the active areas of said MOS transistor and said SCR;

implanting n-doping ions into said p-type semiconductor to form a n-well having side walls;

implanting p-doping ions into said p-type semiconductor surrounding said n-well side walls to form a p-tank;

depositing over said surface a layer of insulating material suitable as gate dielectric, thereby covering said SCR and transistor areas;

depositing a layer of poly-silicon or other conductive material onto said insulating layer;

protecting a portion of said poly-silicon and etching the remainder thereof, thereby defining the gate area of said transistor at the location where said n-well side wall intersects said surface;

depositing a first photoresist layer and opening a window therein, thereby exposing the surface of said p-tank area adjacent said poly-silicon gate;

implanting, at low energy, low dose n-doping ions into said exposed surface area, thereby creating shallow, lightly n-doped layers under said surface;

removing said first photoresist layer;

depositing a first conformal layer of dielectric material including silicon nitride or silicon dioxide over said surface;

directional plasma etching said first dielectric layer so that the only remaining dielectric forms side walls around said poly-silicon gate and covers the extent of the base space charge regions of said transistor;

forming a second patterned photoresist layer to protect a portion of said surface defining the anode of said SCR;

implanting, at medium energy, n-doping ions into said surface, thereby creating n-doped regions that extend to a medium depth under said surface, suitable as deep source and drain of said transistor and said npn portion of said SCR;

removing said second photoresist layer;

depositing a third photoresist layer and opening a window therein, thereby exposing the surface of said anode of said pnp portion of said SCR;

implanting, at medium energy and high dose, p-doping ions into said window, thereby creating a p-doped region at medium depth, suitable as anode of said SCR;

removing said third photoresist layer;

depositing a second conformal layer of dielectric material including silicon nitride or silicon dioxide over said surface;

forming a fourth patterned photoresist layer to protect a portion of said second dielectric layer defining said SCR except for fractional surface portions of said anode and cathode;

removing said second dielectric layer except for said photoresist-protected portion;

removing said fourth photoresist layer; and siliciding the freshly etched surfaces, including said fractional anode and cathode surface portions, thereby leaving the dielectric-protected surface areas of said SCR silicide-blocked.

17. A method of fabricating into the surface of a p-well, having first and second side-walls in a n-tank, a npnp SCR integrated with a drain-extended pMOS transistor for multi-voltage operation having built-in ESD protection, said surface having a layer of insulating material suitable as gate dielectric and a poly-silicon gate deposited on said insulating layer at the location where said first side-wall intersects said surface, comprising the steps of:

depositing a first photoresist layer and opening a window therein, thereby exposing the surface of said n-tank area adjacent said poly-silicon gate and covering said p-well and said n-tank adjacent said second side-wall;

implanting, at low energy and low dose, p-doping ions into said exposed surface area, thereby creating shallow, lightly p-doped layers under said surface and leaving the area under the photoresist unimplanted;

removing said first photoresist layer;

depositing a first conformal layer of dielectric material including silicon nitride or silicon dioxide over said surface;

directional plasma etching said first dielectric layer so that the only remaining dielectric forms side walls around said poly-silicon gate and covers the extent of the base space charge regions of said transistor;

forming a second patterned photoresist layer to protect a portion of said surface defining the anode of said SCR;

implanting, at medium energy, p-doping ions into said surface, thereby creating p-doped regions that extend to a medium depth under said surface, suitable as deep source and drain of said transistor and said pnp portions of said SCR;

removing said second photoresist layer;

depositing a third photoresist layer and opening a window therein, thereby exposing the surface of said anode of said npn portion of said SCR;

implanting, at medium energy and high dose, n-doping ions into said window, thereby creating a n-doped region at medium depth, suitable as anode of said SCR;

removing said third photoresist layer;

depositing a second conformal layer of dielectric material including silicon nitride or silicon dioxide over said surface;

forming a fourth patterned photoresist layer to protect a portion of said conformal layer defining said SCR except for fractional surface portions of said anode and cathode;

removing said second dielectric layer except for said photoresist-protected portion;

removing said fourth photoresist layer; and siliciding the freshly etched surfaces, including said fractional anode and cathode surface portions, thereby leaving the dielectric-protected surface areas of said SCR silicide-blocked.

18. A method of fabricating into the surface of a n-type semiconductor a npnp SCR integrated with a drain-extended nMOS transistor for multi-voltage operation having built-in ESD protection, comprising the steps of:

forming non-conductive isolation regions into said n-type semiconductor for defining the lateral boundaries of the active areas of said MOS transistor and said SCR;

implanting p-doping ions into said n-type semiconductor to form a p-well having side walls;

implanting n-doping ions into said n-type semiconductor surrounding said p-well side walls to form a n-tank;

depositing over said surface a layer of insulating material suitable as gate dielectric, thereby covering said SCR and transistor areas;

depositing a layer of poly-silicon or other conductive material onto said insulating layer;

protecting a portion of said poly-silicon and etching the remainder thereof, thereby defining the gate area of said transistor at the location where said p-well side wall intersects said surface;

depositing a first photoresist layer and opening a window therein, thereby exposing the surface of said n-tank area adjacent said poly-silicon gate;

implanting, at low energy, low dose p-doping ions into said exposed surface area, thereby creating shallow, lightly p-doped layers under said surface;

removing said first photoresist layer;

depositing a first conformal layer of dielectric material including silicon nitride or silicon dioxide over said surface;

directional plasma etching said first dielectric layer so that the only remaining dielectric forms side walls around said poly-silicon gate and covers the extent of the base space charge regions of said transistor;

forming a second patterned photoresist layer to protect a portion of said surface, defining the anode of said SCR;

implanting, at medium energy, p-doping ions into said surface, thereby creating p-doped regions that extend to a medium depth under said surface, suitable as deep source and drain of said transistor and said pnp portion of said SCR;

removing said second photoresist layer;

depositing a third photoresist layer and opening a window therein, thereby exposing the surface of said anode of said npn portion of said SCR;

implanting, at medium energy and high dose, n-doping ions into said window, thereby creating a n-doped region at medium depth, suitable as anode of said SCR;

removing said third photoresist layer;

depositing a second conformal layer of dielectric material including silicon nitride or silicon dioxide over said surface;

forming a fourth patterned photoresist layer to protect a portion of said second dielectric layer defining said SCR except for fractional surface portions of said anode and cathode;

removing said second dielectric layer except for said photoresist-protected portion;

removing said fourth photoresist layer; and siliciding the freshly etched surfaces, including said fractional anode and cathode surface portions, thereby leaving the dielectric-protected surface areas of said SCR silicide-blocked.

* * * * *